United States Patent [19]
Vaziri et al.

[11] Patent Number: 5,892,858
[45] Date of Patent: Apr. 6, 1999

[54] DUOBINARY CODING AND MODULATION TECHNIQUE FOR OPTICAL COMMUNICATION SYSTEMS

[75] Inventors: Mazoud Vaziri, Nepean; Maurice S. O'Sullivan; Terry W. B. Taraschuk, both of Ottawa; Alan Glen Solheim, Kanata, all of Canada; Kim Byron Roberts, Welwyn Garden City, United Kingdom

[73] Assignee: Northern Telecom Limited, Montreal, Canada

[21] Appl. No.: 827,419

[22] Filed: Mar. 27, 1997

[51] Int. Cl.$^6$ ...................................................... G02B 6/10
[52] U.S. Cl. .................................................. 385/2; 341/57
[58] Field of Search ........................... 341/56, 57; 385/2, 385/3, 8, 9, 24

[56] References Cited

U.S. PATENT DOCUMENTS

| | | | |
|---|---|---|---|
| 4,244,051 | 1/1981 | Fujikura et al. | 375/17 |
| 4,910,750 | 3/1990 | Fisher | 341/56 |
| 5,002,353 | 3/1991 | Johnson | 350/96.14 |
| 5,015,053 | 5/1991 | Johnson | 350/96.14 |
| 5,408,500 | 4/1995 | Ginzburg et al. | 375/288 |

FOREIGN PATENT DOCUMENTS

| | | | |
|---|---|---|---|
| 0674 210 A2 | 9/1995 | European Pat. Off. | G02F 1/225 |
| 0701 338 A2 | 3/1996 | European Pat. Off. | H04B 10/155 |
| WO 91/20138 | 12/1991 | WIPO | H04B 10/00 |

OTHER PUBLICATIONS

Steve Ross: "Unipolar/bipolar circuit eases data flow", E.D.N: Electrical Design News, vol. 30, No. 22, Nov. 1985, p. 208.

Yonenaga K. et al: Optical Duobinary Transmission System with no Reciver Sensitivity Degradation Electronics Letters, vol. 31, No. 4, Feb. 16, 1995, pp. 302–304.

Gu X et al: 10 GBIT/S Unrepeatered Three–Level Optical Transmission Over 100 KMOF Standard Fibre Electronics Letters, vol. 29, No. 25, Dec. 9, 1993, pp. 2209–2211.

May et al., "Extended 10 Gb/s Fiber Transmission Distance at 1538 nm Using a Duobinary Receiver", IEEE Photonics Technology Letters, vol. 6, No. 5 (1994).

Price et al., 210 km Repeaterless 10 Gb/s Transmission Experiment Through Nondispersion–Shifted Fiber Using Partial Response Sheme, IEEE Photonics Technology Letters, vol. 7, No. 10 (1995).

Price et al., "Reduced bandwidth optical digital intensity modulation with improved chromatic dispersion tolerance", Electronics Letters, vol. 31, No. 1 (1995).

Yonenaga et al., "Optical duobinary transmission system with no receiver sensitivity degradation", Electronics Letters, vol. 31, No. 4 (1995).

*Primary Examiner*—Hung N. Ngo
*Attorney, Agent, or Firm*—Foley & Lardner

[57] ABSTRACT

A method for encoding a binary input sequence x(0,1) to obtain a duobinary output sequence y(+1,0,−1) is provided. The duobinary coding technique always provides an output bit $y_k=0$ when the corresponding bit $x_k=0$; bits $y_k$ alternatively assume a logical level "+1" and "−1" whenever an input bit $x_{k-1}=0$ changes to $x_k=1$, and the output bit $y_k$ maintains the logical level "+1" or "−1" whenever the corresponding bit $x_k$ maintains the logical level "1". A coding device for encoding a binary input sequence x(0,1) to a duobinary output sequence y(+1,0,−1) is also provided, comprising a D-type flip-flop for generating a binary switch signal. A first AND circuit receives the input sequence and the switch signal, and provides a first binary sequence a(0,1), while a second AND circuit receives the input sequence and the complement of the switch signal and provides a second binary sequence b(0,1). These first and second binary sequences are applied to a summer to obtain the output sequence y(+1,0,−1). A method for differentially driving a M-Z modulator using a virtual ground level is also provided, which reduces the peak-to-peak drive voltage by a factor of two.

20 Claims, 5 Drawing Sheets

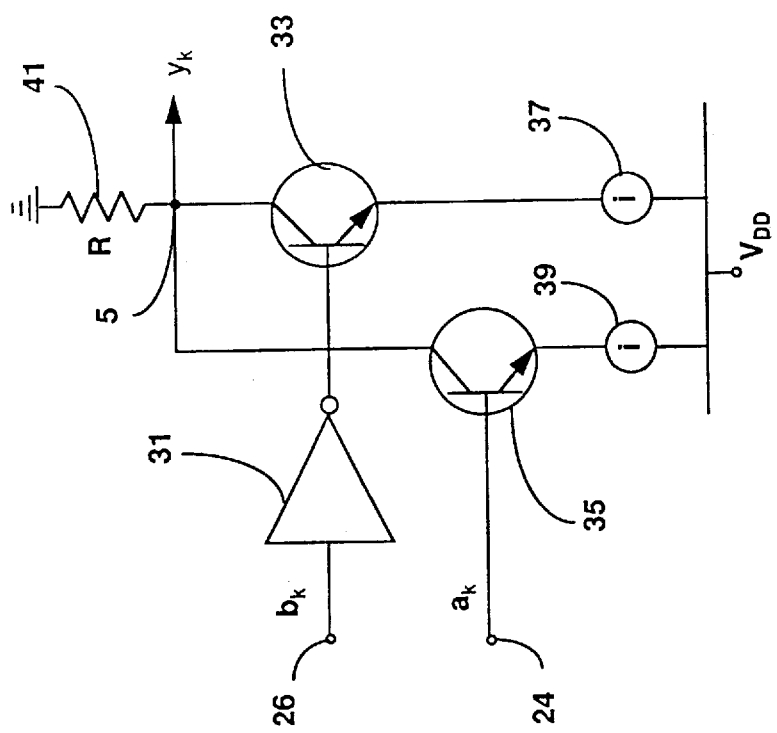

DUOBINARY CODING AND MODULATION TECHNIQUE FOR OPTICAL COMMUNICATION SYSTEMS

BACKGROUND OF THE INVENTION

1. Field of the Invention

This invention is directed to an encoding and modulation technique for communication systems, and more particularly to a duobinary coding and modulation technique for optical transmission systems.

2. Background Art

In the long haul, high bit rate optical fiber telecommunications, appropriate coding and modulation of the signal for transmission are essential. As the demand grows for bit rates of 10 Gb/s or more, certain inherent limitations of the transmitter and the fiber come into effect. One of these limitations is the chromatic dispersion, which can be relaxed if modulation bandwidth of the optical signal is reduced.

Coding

Duobinary signaling was introduced a few decades ago and its details can be found in, for example, "Introduction To Telecommunication Systems", F. G. Stremler, Addison-Wesley Publishing Company, 2nd edition, 1982. In binary transmission systems, only two symbols "d" and "n" are used, and more particularly, the bits of information take on two values, logic "1" and logic "0". One of these two possible signals is transmitted during each T-second signaling interval. Duobinary signaling uses two levels for the non-zero signals, for example, "-1" and "1", resulting in three symbols: "-1", "0", and "1". If a binary signal requires a bandwidth of $B_2$, the bandwidth for duobinary signaling is, in theory, $B=B_2/2$. Thus, the duobinary signal has one half the transmission bandwidth of the binary signal for encoding the same information. Therefore, this type of signaling can be used to reduce the effect of dispersion, which in turn reduces the high inter-symbol interference at long transmission distances.

There are a number of solutions for constructing a duobinary sequence from a binary one. In general, any duobinary encoding scheme is based on introducing inter-symbol interference (ISI), controlled in such a way that it comes only from the immediately preceding symbol. According to a currently employed scheme, two successive binary inputs are added so that $y_k=x_k+x_{k-1}$, where $x_k$ is the input sequence and $y_k$ is the output sequence. For this solution, the receiver must solve the equation $x'_k=y_k+x'_{k-1}$, where $x'$ is the decoded binary data stream. Solving this equation implies providing additional circuitry at the receiver. In addition, decoding errors tend to propagate in the system according to this solution.

Another known solution is to first pre-code the binary data using an exclusive OR (XOR) operation, $p_k=x_k \oplus p_{k-1}$. The XOR-coded binary sequence $p_k$ is then used to form a time varying binary signal. This simplifies the decoding rule, in that the receiver makes each binary decision based only on the current received sample, the ISI still being controlled. Thus, at the receiver, $x'_k=0$ if $y_k \pm d$; and $x'_k=1$ if $y_k=0$.

U.S. Pat. No. 5,408,500 (Ginzburg et al., issued Apr. 18, 1995 and assigned to Digital Equipment Corporation) discloses such a duobinary encoding technique for transmission of high speed signals over a twisted pair. The duobinary encoding is followed by an appropriate filtering of the encoded signal. The resulting duobinary sequence is equivalent to the binary input, except that the original binary $x_k=1$ are encoded as either + or – levels. When the input binary "1"s are separated by an odd number of "0"s, the "1"s are encoded as pulses of opposite polarity in the duobinary sequence. When the input binary "1"s are separated by an even number of "0"s, the "1"s are encoded as pulses of the same polarity in the duobinary sequence.

However, the pre-coding operation necessary according to the above technique results in a somewhat complex structure of the transmitter.

Modulation

Most optical fiber transmitters use an external modulator. In many cases, the transmitter's light source is a semiconductor laser operating in continuous wave (CW) mode and the external modulator changes the phase of the CW signal at the appropriate bit rate. One such modulator is a Mach-Zehnder (M-Z) interferometer. A M-Z interferometer comprises a pair of wave-guide channels, or arms, connected between an optical wave-guide splitter and a wave-guide combiner. The light source is optically coupled to the wave-guide splitter, which serves as a Y-branch splitter or directional coupler. The two light beams from the splitter travel through the wave-guide arms and are reunited by the wave-guide combiner. The recombined light exits the output port of the wave-guide combiner and is then optically coupled to an optical fiber for transmission.

The optical M-Z interferometer operates on the principle of interference between the two optical waves, which have been separated from a common wave at the modulator's input port, at the point of their recombination near the modulator's output port. The interference condition is controlled by the difference between distances travelled by these two waves between the point of separation and the point of recombination. These distances are controlled by varying the optical indices of the two wave-guides which define the optical paths between separation and recombination.

It is common practice to ensure a particular condition of interference, despite wave-guide variations in modulator manufacture, by combining the varying drive voltages which are used to modulate the condition of interference with a substantially constant bias voltage. This is often done using a bias tee. In the following is assumed that the modulator has been adequately biased. In M-Z interferometric modulators with a three-electrode configuration, a first and second electrode is each associated with an optical wave-guide arm. These are also called travelling wave electrodes. A third electrode is generally disposed between the arms.

Under one arm, or single arm, modulation a driving voltage varying between 0 and $-V\pi$ is provided to the first electrode, while the second electrode is held at a constant bias voltage. Disadvantageously, the available drive voltage according to this method of modulation effects a phase shift in only the arm associated with the first electrode, thereby limiting the achievable modulation depth for a given voltage in comparison with other methods described herein.

In both arms, or dual arm modulation, the voltage is divided between the two arms, for example 0 to $-V\pi/2$ on one arm, and $-V\pi/2$ to $-V\pi$ on the other, and the third electrode is connected to ground. This phase shifting modulation method is known as push-pull.

In both above modulation techniques, the two beams arrive at the wave-guide combiner in phase in the absence of a modulating voltage, giving an intensity maximum or an "on" condition. Conversely, a modulating voltage supplied to one or both arms results in a differential phase change, giving rise to an intensity minimum or "off" condition. As such, the push-pull configuration utilizes the drive voltage more efficiently than the one arm modulation in that, for a given voltage, twice the net phase shift is effected.

The reported literature on experiments using the above-identified duobinary pre-coding and modulation techniques can be classified according to the choice of the bias voltage to the external modulator and the intensity levels in the drive signal. In the first group, three distinct optical intensity levels are created by the duobinary drive signal, as disclosed in the article "Extended 10 Gb/s Fiber Transmission Distance at 1538 nm Using a Duobinary Receiver", by G. May et al., IEEE Photonics Technology Letters, Vol. 6, No. 5, 1994 (hereinafter referred to as reference [1]). In the second group, the duobinary drive creates two intensity levels, as shown in the papers "Reduced Bandwidth Optical Digital Intensity Modulation With Improved Chromatic Dispersion Tolerance", by A. J. Price et al., Electronics Letters, Vol. 31. No. 1, 1995 (hereinafter referred to as reference [2]); "Optical Duobinary Transmission System With No Receiver Sensitivity Degradation" by K. Yonenga et al., Electronics Letters, Vol. 31, No. 4, 1995 (hereinafter referred to as reference [3]); and "210 km Repeaters 10 Gb/s Transmission Experiment Through Non Dispersion-Shifted Fiber Using Partial Response Scheme" by A. J. Price et al., IEEE Photonics Technology Letters, Vol. 7, No. 10, 1995 (hereinafter referred to as reference [4]). This latter approach simplifies the detection scheme, however, neither technique can always reduce the signal bandwidth by a factor of two.

Reference [1] discloses a duobinary system that requires additional circuitry at both the transmitter and receiver to accommodate three level signals. The transmitter includes an encoder comprising an XOR gate with a delayed feedback path for determining each symbol of the duobinary sequence from the current and the previous symbol. The receiver comprises two decision circuits, one having a low threshold to distinguish a "0" level from a "1" level and the other having a high threshold to distinguish a "1" level from a "2" level. The tests concluded that the dispersion has less effect on the duobinary receiver than on the binary receiver over the distance range tested. However, additional hardware has to be installed at the receiver for decoding the incoming signal, with the resulting penalty in receiver sensitivity.

References [2], [3] and [4] disclose a modulation scheme whereby two intensity levels are obtained after modulation of a carrier signal with a duobinary sequence. The optical signal has a central level resulting in maximum extinction, the "0" optical level, and two outer levels resulting in equal intensities, the "1" optical level. The optical signal exhibits characteristics that meet the requirements of existing SDH and SONET interface standards, and therefore a conventional receiver is required for reception. However, the examples discussed in these publications use a differentially encoded data stream with a bias voltage for the Mach-Zehnder modulator about the point of maximum extinction for nullifying the optical carrier, with the inherent control circuitry.

As these references disclose standard duobinary coding techniques which involve pre-coding of the signal and push-pull or single arm modulation methods, they all suffer from the drawbacks described above.

There is a need for a duobinary encoding technique that is simple, does not require additional circuitry at the receiver, uses an easy-to-implement encoding circuit, and provides an encoded signal with a low dc component and reduced transmission bandwidth.

There is also a need for a modulation method which may be used efficiently in high speed operation, is voltage efficient and suitable for use with a duobinary coding technique to obtain a reduced bandwidth of the transmitted signal and prolongs the lifespan of the external modulator.

SUMMARY OF THE INVENTION

It is an object of this invention to provide a duobinary coding and modulation technique for optical communication systems which reduces the drawbacks inherent with the prior art techniques.

It is another object of the invention to provide a duobinary coding circuit that is used to drive an external modulator, no pre-coding circuit being necessary at the transmitter site, and no additional decoding circuitry being necessary at the receiver site. The coding circuit according to this invention also behaves as a band limiting element.

It is another object of the invention to provide a duobinary coding technique that is simple, provides a modulation signal with substantially no dc component and provides a bandwidth reduction factor of substantially two for a given symbol rate.

Still another object of this invention is to provide an optical modulation technique based on a single ended push-pull driven modulator or a differentially driven modulator with virtual ground.

Accordingly, the invention is directed to a method for encoding a binary input sequence to obtain a duobinary output sequence y(+d,n,-d), comprising the steps of: providing a first logical level "n" for a bit $y_k$ of the duobinary output sequence y(+d,n,-d) when a corresponding bit $x_k$ of the binary input sequence x(n,d) has the first logic level "n"; switching a bit $y_k$ of the duobinary output sequence y(+d, n,-d) from the first level "n" to alternatively assume one of a second "+d" and a third "-d" logical level, whenever a succession $x_{k-1}$, $x_k$ of bits in the input sequence x(n,d) comprises a change from the first logical level "n" to the second logical level "d"; and maintaining the logical level of a bit $y_k$ as one of the second "+d" and the third "-d" logical level, whenever a corresponding bit $x_k$ maintains the second logical level "d" and whenever a succession $x_{k-1}$, $x_k$ of bits the input sequence x(n,d) comprises a change from the second logical level "n" to the first logical level "d".

According to another aspect, the invention includes a method for encoding a binary input sequence x(0,1) to obtain a duobinary output sequence y(+1,0,-1), comprising the steps of: preparing from the input sequence x(0,1) a binary switch signal Q(0,1) which maintains a current logical value when the input sequence x(0,1) comprises one of: a succession of bits $x_k$=0, a succession of bits $x_k$=1, and a succession of bits $x_k$=0, $x_k$=1, and switches to the opposite logical value when the input sequence x(0,1) comprises a succession of bits $x_k$=1, $x_{k+1}$=0; logically adding the binary input sequence x(0,1) and the switch signal Q(0,1) to obtain a first binary sequence a(0,1); logically adding the binary input sequence x(0,1) and the complement $\overline{Q}(1,0)$ of the switch signal to obtain a second binary sequence b(0,1); and summing the first and second binary sequences for obtaining the duobinary output sequence y(+1,0,-1).

The invention further includes a coding device for encoding a binary input sequence x(0,1) to a duobinary output sequence y(+1,0,-1), comprising: means for generating a binary switch signal Q(0,1); a first AND circuit for receiving the binary input sequence x(0,1) and the switch signal Q(0,1), and providing a first binary sequence a(0,1); a second AND circuit for receiving the binary input sequence x(0,1) and the complement $\overline{Q}$(1,0) of the switch signal to obtain a second binary sequence b(0,1); and a summer for processing the first and second binary sequences to obtain the output sequence y(+1,0,−1) on an output terminal.

The invention also provides a modulation technique using a Mach-Zehnder (M-Z) interferometer for modulating a continuous wave (CW) optical carrier with a duobinary encoded differential driving signal, the M-Z interferometer having a first and a second travelling wave-guide, a splitter between an input port and the first and second travelling wave-guides, a combiner between the first and second travelling wave-guides and an output port, a first and a second travelling wave electrode, each associated with the respective first and second travelling wave-guide, the M-Z interferometer further comprises: means for applying the modulating signal to a splitter side of the first travelling wave electrode and for applying the complementary modulating signal to a splitter side of the second travelling wave electrode; a first matched impedance for connection with a first end to a combiner side of the first travelling wave electrode and with a second end to ground; a second matched impedance for connection with a first end to a combiner side of the second travelling wave electrode and with a second end to ground; means for coupling the CW optical carrier signal to the input port; and means for coupling a duobinary modulated optical signal from the output port into an optical fiber.

Advantageously, the technique according to this invention converts a binary input to a duobinary output regardless of the incoming data rate. Hence, a factor of two bandwidth reduction is obtained, which is not the case with the standard duobinary scheme. The coded signal generated according to the invention also has a smaller dc component. The smaller dc component results in better suppression of the carrier frequency. This, in turn, shifts the onset of stimulated Brillouin scattering threshold to higher launch powers. Hence, a higher optical power may be launched onto the fibers.

In addition, the modulation technique using a duobinary encoded differential driving signal according to the invention allows for a reduced amplitude required of individual drivers to approximately half that required for the conventional push-pull drive configurations.

BRIEF DESCRIPTION OF THE DRAWINGS

The foregoing and other objects, features and advantages of the invention will be apparent from the following more particular description of the preferred embodiments, as illustrated in the appended drawings, where:

FIG. 2A is a circuit diagram of the adder of the coding circuit;

FIG. 2B is the truth table for the adder;

DESCRIPTION OF THE PREFERRED EMBODIMENT

According to the classic duobinary coding techniques, a pre-coding is effected to an input binary signal x(0,1) to obtain a pre-coded signal p(0,1), using the equation $p_k$=XOR ($x_k$, $p_{k-1}$). Next, "0"s are replaced with "−1"s in the pre-coded signal to obtain a sequence p'(0,1,−1) and the drive sequence is obtained by a further operation, $y_k=p'_{k-1}+p'_k$. As a result, for any odd number of "1"s in a row, modulation bandwidth of the drive signal is reduced by a factor of two. As well, the E-field has no component at the carrier frequency. However, this is not the case with an input sequence having an even number of successive "1"s, as shown in the examples of Table 1.

TABLE 1

Examples of input bit sequences that give similar duobinary sequences (Prior Art)

Example 1

| | | | | | | | | | | | | | | | |
|---|---|---|---|---|---|---|---|---|---|---|---|---|---|---|---|
| input $x_k$ | | 0 | 0 | 1 | 1 | 0 | 0 | 1 | 1 | 0 | 0 | 1 | 1 | 0 | 0 |
| pre-coded $p_k$ | 0 | 0 | 0 | 1 | 0 | 0 | 0 | 1 | 0 | 0 | 0 | 1 | 0 | 0 | 0 |
| modified $p'_k$ | | −1 | −1 | −1 | −1 | −1 | −1 | −1 | −1 | −1 | −1 | −1 | −1 | −1 | −1 |
| duobinary $y_k$ | | 1 | 1 | 0 | 0 | 1 | 1 | 0 | 0 | 1 | 1 | 0 | 0 | 1 | 1 |

Example 2

| | | | | | | | | | | | | | | | |
|---|---|---|---|---|---|---|---|---|---|---|---|---|---|---|---|
| input $x_k$ | | 0 | 0 | 0 | 0 | 1 | 1 | 1 | 1 | 0 | 0 | 0 | 0 | 1 | 1 |
| pre-coded $p_k$ | 0 | 0 | 0 | 0 | 0 | 1 | 0 | 1 | 0 | 0 | 0 | 0 | 0 | 1 | 0 |
| modified $p'_k$ | | −1 | −1 | −1 | −1 | −1 | −1 | −1 | −1 | −1 | −1 | −1 | −1 | −1 | −1 |
| duobinary $y_k$ | | 1 | 1 | 1 | 1 | 0 | 0 | 0 | 0 | 1 | 1 | 1 | 1 | 0 | 0 |

In the above examples, the bandwidth of the driving signal is identical to the bandwidth of the binary input signal, and the dc component is the same as that of the binary input signal. Therefore, this scheme does not eliminate the dc component in general, rather, it reduces the dc for certain patterns.

The duobinary encoding according to the present invention affects only non-zero input bits. An input bit "0" results in a "0" output bit. The input bits "1" are replaced by output bits "1"s or "−1"s. This is done in such a way that the only allowed transitions at the output are from "1", to any number of "0"s and to "−1", or vice versa. In this way, the number of "1"s in the driving signal is substantially equal to the number of "−1"s. Hence, a maximum reduction of the dc component is obtained.

Figure 1:
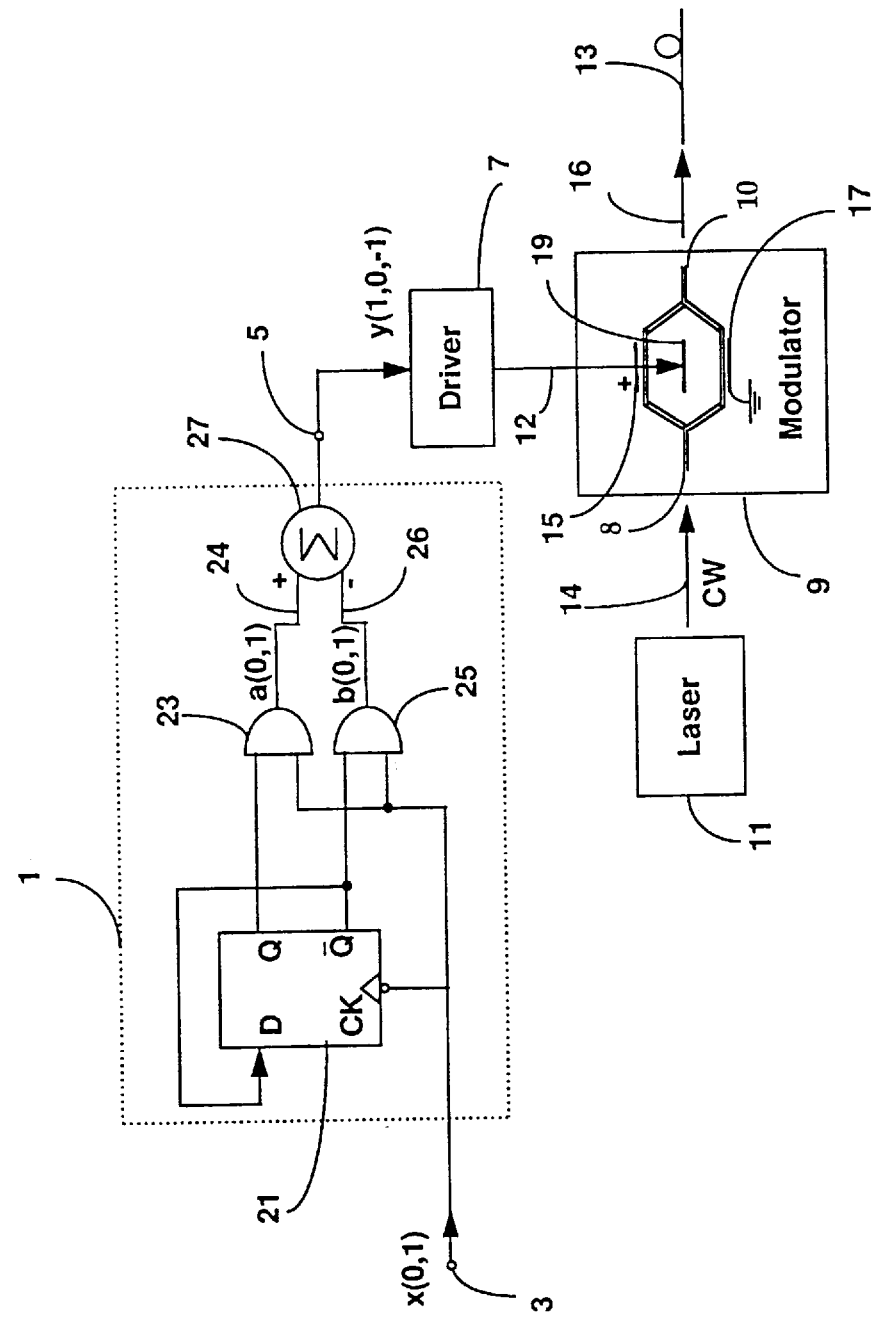
FIG. 1 illustrates the coding circuit according to this invention.

FIG. 1 illustrates the blocks used to perform the duobinary coding and modulation operations according to the invention. A coding circuit 1 receives the binary input sequence x(0,1) at the input 3 and provides the duobinary output sequence y(0,1,−1) at output 5. The output sequence y(0,1,−1) is input to driver 7 which provides the driving signal 12 on electrode 19 of modulator 9.

Modulator 9 illustrated in the embodiment of FIG. 1 is a Mach-Zehnder interferometer. A bias voltage $V_{Bias}$ is applied between travelling wave electrodes 15 and 17. A laser 11 provides a CW optical carrier signal 14 to the input port 8 of the optical wave-guide splitter of modulator 9 in the known manner. A modulated optical signal 16 is obtained at the output port 10 of the wave-guide combiner of the modulator and coupled into optical fiber 13 for transmission.

Coding circuit 1 comprises a D-type flip-flop 21 connected with the inverting output $\overline{Q}$ to the D input for obtaining a delay with a period T, which is needed for simultaneously obtaining the bits $x_k$ and $x_{k-1}$. The binary stream x(0,1) is applied to the clock input of the flip-flop 21. The state of this flip-flop after each bit $x_k$ is equal to the input (D) before the bit $x_k$, or in other words $x_k$=D. In this way, whenever the input sequence x(0,1) comprises a succession of "0"s, a succession of "1"s or a "0" bit followed by a "1", flip-flop 21 maintains its anterior state, which could be logic "0", with Q=0, $\overline{Q}$=1, or logic "1", with Q=1, $\overline{Q}$=0. Whenever a logic "1" $x_k$ bit is followed by a logic "0", flip-flop 21 changes its state. This is shown in rows 2 and 3 of Tables 2 and 3 below.

The binary stream x(0,1) is also applied to an input of a first AND gate 23 and an input of a second AND gate 25. The second input of AND gate 23 receives the output Q of flip-flop 21, such that a binary sequence a(0,1) is obtained at the output of AND gate 23, where each bit $a_k$ of sequence a is defined $a_k = x_k + x_{k-1}$. This is shown in row 4 of Tables 2 and 3 below.

The second input of AND gate 25 receives output $\overline{Q}$ from flip-flop 21, such that a binary sequence b(0,1) is obtained at the output of AND gate 23, where each bit $b_k$ of the sequence b is defined $b_k = x_k + \overline{x}_{k-1}$. This is illustrated in row 5 of Tables 1 and 2 below.

The output of both AND gates 23 and 25 is applied to a summation circuit 27 to provide the coded stream y(0,1,−1) at output 5. The summation circuit 27 effects an algebraic summation of the signals, rather than the logic "AND" effected by gates 23 and 25.

Figure 1A:
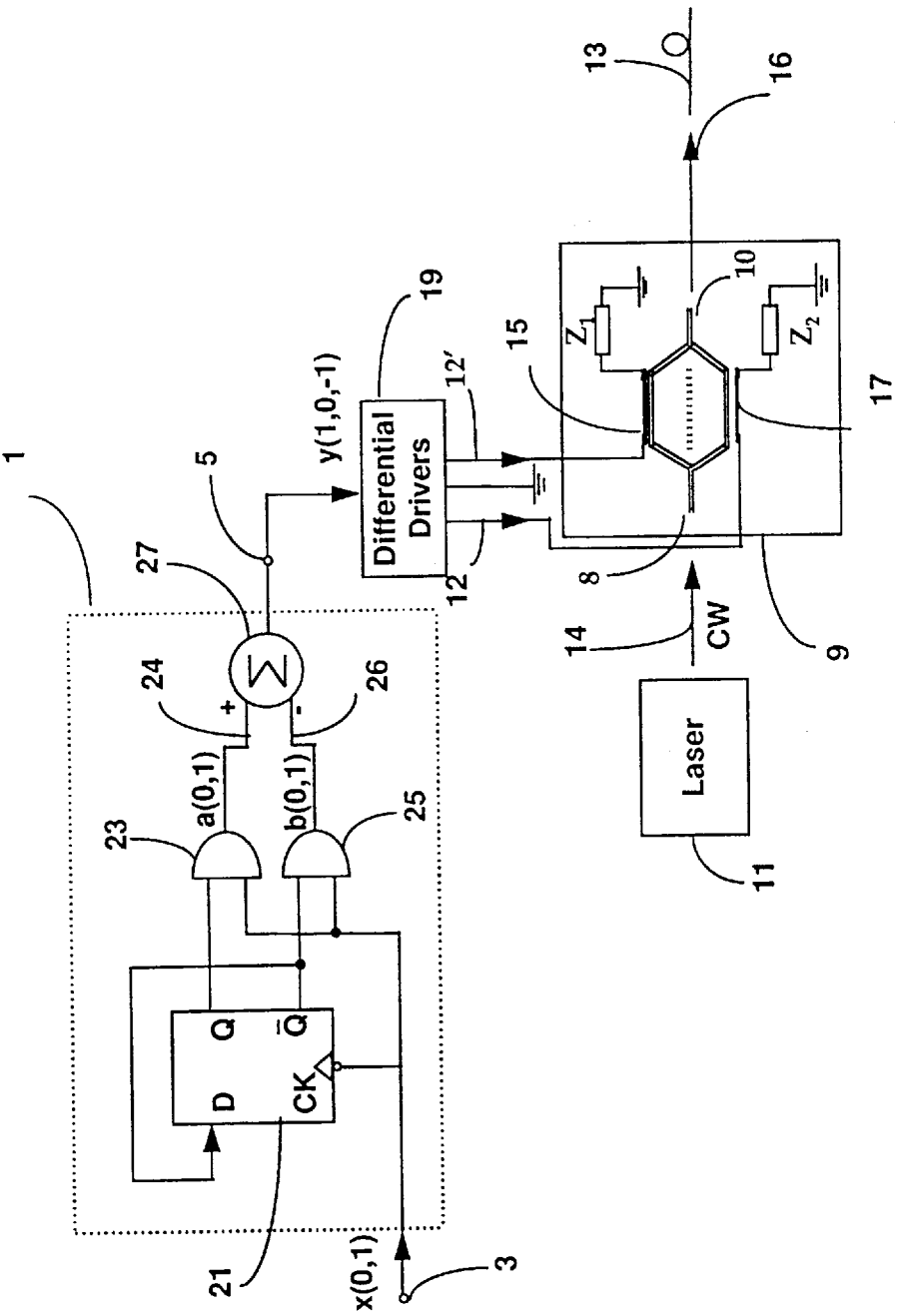
FIG. 1A shows the coding circuit for a M-Z modulator configuration which is driven differentially.

Another advantageous implementation of the optical modulation operation according to this invention is based on a M-Z modulator configuration that is driven differentially, as shown in FIG. 1A. In this case, the driving signal is a differential signal provided on lines 12 and 12', respectively, these being generated with a differential pair of drivers 19 from duobinary sequence y(1,0,−1). Travelling wave electrodes 15, 17 receive each on a first end, close to input 8, the active electrically modulated signal from the respective line 12 or 12'. A first matching impedance $Z_1$ connects the second end of electrode 15, close to the output port 10 of the modulator to ground, while a second matching impedance $Z_2$ connects the second end of electrode 17 to ground.

In this way, the impedance of each travelling wave electrode is substantially twice the impedance to ground of the individual active lines, creating a virtual ground line. This virtual ground line is not electrically connected to a physical ground, but is located somewhere between the travelling wave drive electrode, substantially parallel to the direction of propagation of the drive RF wave. The effect of using this drive implementation is to reduce the drive amplitude required of individual drive circuits to approximately half that required for the push-pull drive configuration described earlier.

The following examples show how a binary input sequence is transformed into the duobinary output sequence according to the invention:

TABLE 2

Example 1 of coding a binary sequence $x_k$, comprising an even number of successive "1"s into a duobinary sequence $y_k$

| | | | | | | | | | | | | | | | |
|---|---|---|---|---|---|---|---|---|---|---|---|---|---|---|---|
| 1 | Binary input $x_k$ | 1 | 1 | 0 | 0 | 1 | 1 | 0 | 0 | 1 | 1 | 0 | 0 | 1 | 1 |
| 2 | Q | 0 | 0 | 1 | 1 | 1 | 1 | 0 | 0 | 0 | 0 | 1 | 1 | 1 | 1 |
| 3 | $\overline{Q}$ | 1 | 1 | 0 | 0 | 0 | 0 | 1 | 1 | 1 | 1 | 0 | 0 | 0 | 0 |
| 4 | $a_k = x_k$ AND Q | 0 | 0 | 0 | 0 | 1 | 1 | 0 | 0 | 0 | 0 | 0 | 0 | 1 | 1 |
| 5 | $b_k = x_k$ AND $\overline{Q}$ | 1 | 1 | 0 | 0 | 0 | 0 | 0 | 0 | 1 | 1 | 0 | 0 | 0 | 0 |
| 6 | $y_k = a_k + b_{k-1}$ | 1 | 1 | 0 | 0 | −1 | −1 | 0 | 0 | 1 | 1 | 0 | 0 | −1 | −1 |

TABLE 3

Example 2 of coding a binary sequence $x_k$ into a duobinary sequence $y_k$

| | | | | | | | | | | | | | | | |
|---|---|---|---|---|---|---|---|---|---|---|---|---|---|---|---|
| 1 | Binary input $x_k$ | 0 | 1 | 0 | 1 | 0 | 1 | 0 | 0 | 1 | 1 | 1 | 1 | 0 | 0 | 1 |
| 2 | Q | 0 | 0 | 1 | 1 | 0 | 0 | 1 | 1 | 1 | 1 | 1 | 1 | 0 | 0 | 0 |
| 3 | $\overline{Q}$ | 1 | 1 | 0 | 0 | 1 | 1 | 0 | 0 | 0 | 0 | 0 | 0 | 1 | 1 | 1 |
| 4 | $a_k = x_k$ AND Q | 0 | 0 | 0 | 1 | 0 | 0 | 0 | 0 | 1 | 1 | 1 | 1 | 0 | 0 | 0 |
| 5 | $b_k = x_k$ AND $\overline{Q}$ | 0 | 1 | 0 | 0 | 0 | 1 | 0 | 0 | 0 | 0 | 0 | 0 | 0 | 0 | 1 |
| 6 | $y_k = a_k + b_{k-1}$ | 0 | 1 | 0 | −1 | 0 | 1 | 0 | 0 | −1 | −1 | −1 | −1 | 0 | 0 | 1 |

FIG. 2A illustrates an embodiment of the summation circuit according to this invention, which receives bits $a_k$ and $b_k$ of the binary sequence a(0,1) and b(0,1) and provides the bits $y_k$ of the output sequence. FIG. 2B shows the truth table for the circuit of FIG. 2A. As seen in the above Tables 2 and 3, the bits of the output sequence y(0,1,−1) take a first value, defined as logic "1" when $a_k$=0 and $b_k$=1, a second value, defined as logic "−1" when $a_k$=1 and $b_k$=0, and a third value, defined as logic "0", when both $a_k$=$b_k$=0. It is to be noted that $a_k$=1, and $b_k$=1 is not a valid input, as seen above in connection with the description of the coding circuit.

The summation circuit comprises a first transistor 35 which receives the bits of the first binary sequence a(0,1) on the base. The collector of transistor 35 is connected to a load resistor (R), referred to with numeral 41, and the emitter is connected to $V_{DD}$ through a current source 39. A second transistor 33 receives on its base an inverted version of the second binary sequence b(0,1), provided by inverter 31. The collector of transistor 33 is also connected to the load resistor 41 and the emitter to a second current source 37. Both current sources 37 and 39 provide a current "i" through resistor R when the respective transistor conducts.

A bit $y_k$ obtained at output 5 can take three different values, iR, 2iR and 0. $y_k$ takes the value i·R when signals $a_k$ and $b_k$ are logic "0", which corresponds to transistor 33 conducting and transistor 35 being blocked. When $a_k$=0 and $b_k$=1, the signal $\overline{b}_k$ becomes logic "0", and transistors 33 and 35 are both conducting, so that the potential at output 5 takes the value 2i·R. When $a_k$=1 and $b_k$=0, the signal $\overline{b}_k$ becomes logic "1" and both transistors are blocked, and $y_k$ becomes 0. If the summation circuit 27 is ac coupled, the three levels become: logic "1" is i·R; logic "0" is 0; and logic "−1" is −i·R.

Figure 3:
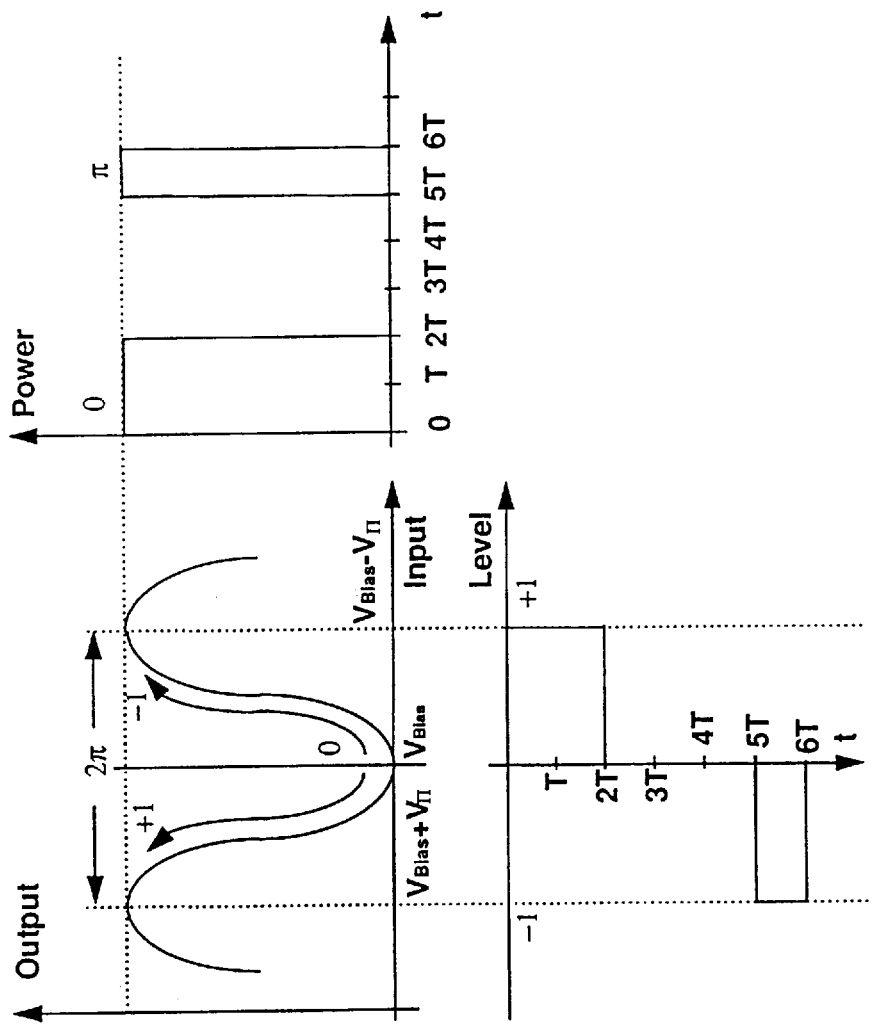
FIG. 3 illustrates the principle of modulation.

It is also to be noted that the adder illustrated in FIG. 3 may replace the driver module 7.

FIG. 3 illustrates how the modulation is effected for a duobinary sequence "1,0,0,0,−1,−1. The bias voltage $V_{Bias}$ is applied between electrodes 15 and 17 and the duobinary coded driving sequence is applied on electrode 19 of modulator 9, as shown in FIG. 1. The optical duobinary signal has two levels "on" and "off", the phase of the "on" state alternatively taking values of "0" and "π". For the case shown in FIG. 1A, $V_{Bias}$ is the virtual ground voltage obtained as discussed above.

Figure 4:
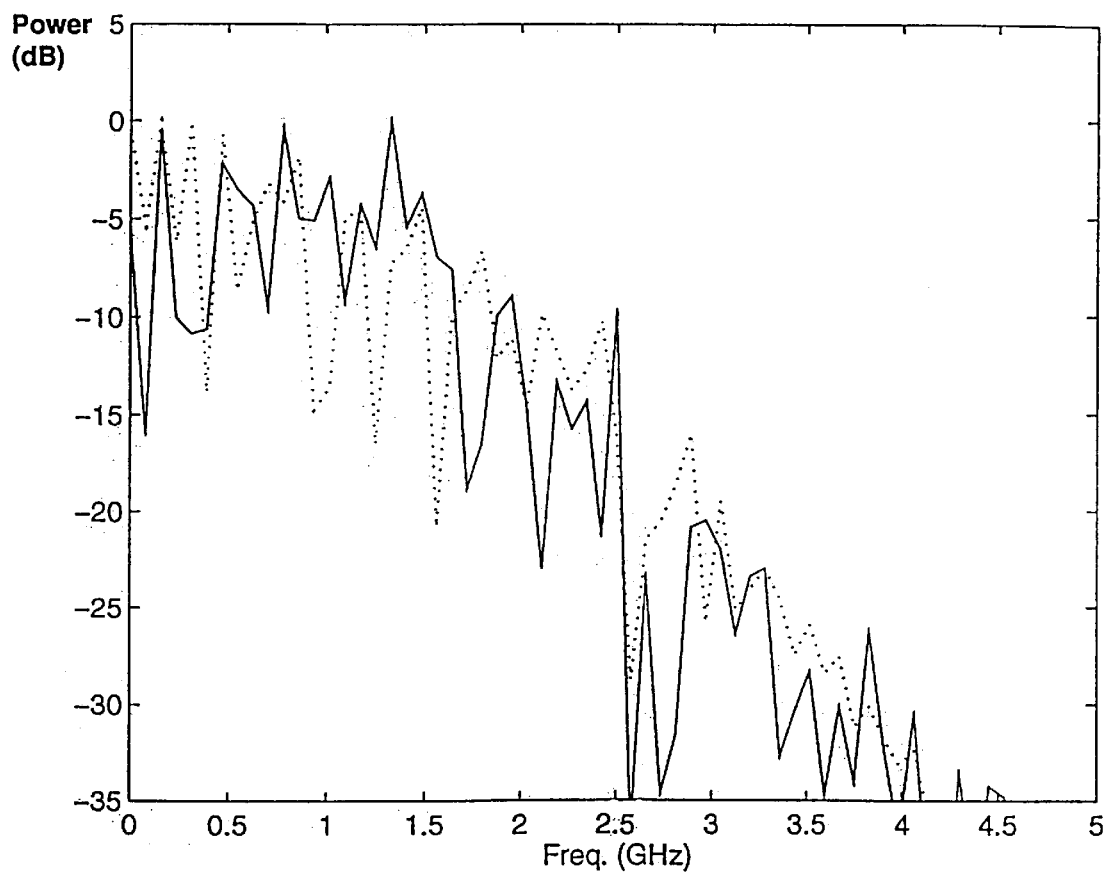
FIG. 4 illustrates the filtered power spectral density versus frequency diagram of a signal encoded according to the invention and prior art.

FIG. 4 shows in solid lines the variation of the spectral density with frequency for an optical signal obtained with the duobinary encoder of FIG. 1. The dotted line illustrates the same parameter for the duobinary scheme reported in [2], [3] and [4]. A pseudo-random bit sequence (PRBS) was used for this comparison. As seen in FIG. 4, the dc component for the solid line curve obtained with the coding circuit of the invention is lower than the dc component of the prior art encoders.

While the invention has been described with reference to particular example embodiments, further modifications and improvements which will occur to those skilled in the art, may be made within the purview of the appended claims, without departing from the scope of the invention in its broader aspect.

What is claimed is:

1. A method for encoding a binary input sequence x(n,d) to obtain a duobinary output sequence y(+d,n,−d), comprising the steps of:

providing a first logical level "n" for a bit $y_k$ of said duobinary output sequence y(+d,n,−d) when a corresponding bit $x_k$ of said binary input sequence x(n,d) has said first logic level "n";

switching a bit $y_k$ of said duobinary output sequence y(+d,n,−d) from said first level "n" to alternatively assume one of a second "+d" and a third "−d" logical level, whenever a succession $x_{k-1}$, $x_k$ of bits in said input sequence x(n,d) comprises a change from said first logical level "n" to said second logical level "d"; and maintaining the logical level of a bit $y_k$ as one of said second +d" and said third "−d" logical level, whenever a corresponding bit $x_k$ maintains said second logical level "d" and whenever a succession $x_{k-1}$, $x_k$ of bits said input sequence x(n,d) comprises a change from said second logical level "n" to said first logical level "d".

2. A method as claimed in claim 1, wherein said first logical level "n" is logic "0", said second logical level "d" is logic "+1" and said third logical level "−d" is "−1".

3. A method as claimed in claim 1, wherein said first logical level "n" is logic "1", said second logical level "d" is logic "0" and said third logical level "−d" is "−0".

4. A method for encoding a binary input sequence x(0,1) to obtain a duobinary output sequence y(+1,0,−1), comprising the steps of:

preparing from said input sequence x(0,1) a binary switch signal Q(0,1) which maintains a current logical value when the input sequence x(0,1) comprises one of: a succession of bits $x_k$=0, a succession of bits $x_k$=1, and a succession of bits $x_k$=0, $x_k$=1, and switches to the opposite logical value when the input sequence x(0,1) comprises a succession of bits $x_k$=1, $x_{k+1}$=0;

logically adding said binary input sequence x(0,1) and said switch signal Q(0,1) to obtain a first binary sequence a(0,1);

logically adding said binary input sequence x(0,1) and the complement $\overline{Q}(1,0)$ of said switch signal to obtain a second binary sequence b(0,1); and summing said first and second binary sequences for obtaining said duobinary output sequence y(+1,0,−1).

5. A method as claimed in claim 4, wherein said step of preparing comprises the sub-steps of:

providing a D-type flip-flop having a clock input, an input D, an output Q and an output $\overline{Q}$;

connecting said output $\overline{Q}$ to said input D of said D-type flip-flop;

applying said input sequence x(0,1) to the clock input; and collecting said switch signal on said output Q of said D-type flip-flop.

6. A method as claimed in claim 4, wherein said step of summing comprises adding the level corresponding to a bit $a_k$ of said first binary sequence a(0,1) with the level corresponding to a bit $b_k$ of said second binary sequence b(0,1).

7. A method as claimed in claim 4, further comprising the steps of generating a driving signal from said output sequence y(+1,0,−1).

8. A method as claimed in claim 7, further comprising the steps of:

providing an external modulator having a first and a second travelling wave-guide, a splitter between an input port and said first and second travelling wave-guides, a combiner between said first and second travelling wave-guides and an output port, a first and a second travelling wave electrode, each associated with said respective first and second travelling wave-guide, and a control electrode;

ac coupling said driving signal to an external modulator; and modulating a continuous wave (CW) optical carrier signal with said driving signal using said external modulator.

9. A method as claimed in claim 8, wherein said external modulator is a Mach-Zehnder interferometer and said step of modulating comprises:

aligning said input port to provide said CW optical carrier signal at said input port of said Mach-Zehnder interferometer; and aligning said output port to couple a duobinary modulated optical signal into an optical fiber.

10. A method as claimed in claim 8, wherein said step of modulating comprises:

applying a bias voltage $V_{Bias}$ between said first and said second travelling wave electrodes; and applying said driving signal to said control electrode.

11. A method as claimed in claim 4, further comprising the steps of generating a differential driving signal from said output sequence y(+1,0,−1), said differential driving signal comprising a driving signal and a complementary driving signal.

12. A method as claimed in claim 11, further comprising the steps of:

providing an external modulator having a first and a second travelling wave-guide, a splitter between an input port and said first and second travelling wave-guides, a combiner between said first and second travelling wave-guides and an output port, a first and a second travelling wave electrode, each associated with said respective first and second travelling wave-guide;

ac coupling said driving signal to an external modulator; and modulating a continuous wave (CW) optical carrier signal with said driving signal using said external modulator.

13. A method as claimed in claim 12, wherein said step of modulating comprises:

connecting a first end of a first impedance to a combiner side of said first travelling wave electrode and connecting a second end of said first impedance to ground;

connecting a first end of a second impedance to a combiner side of said second travelling wave electrode and connecting a second end of said second impedance to ground;

applying said driving signal to a splitter side of said first travelling wave electrode and applying said complementary driving signal to a splitter side of said second travelling wave electrode; and adjusting the value of said first and second impedances to obtain a virtual ground for said driving signal and said complementary driving signal.

14. A coding device for encoding a binary input sequence x(0,1) to a duobinary output sequence y(+1,0,−1), comprising:

means for generating a binary switch signal Q(0,1);

a first AND circuit for receiving said binary input sequence x(0,1) and said switch signal Q(0,1), and providing a first binary sequence a(0,1);

a second AND circuit for receiving said binary input sequence x(0,1) and the complement $\overline{Q}$(1,0) of said switch signal to obtain a second binary sequence b(0,1); and a summer for processing said first and second binary sequences to obtain said output sequence y(+1,0,−1) on an output terminal.

15. A device as claimed in claim 14, wherein said means for generating is a D-type flip-flop having a clock input, an input D, an output Q and an output $\overline{Q}$, for receiving said binary input sequence x(0,1) on the clock input, and said output $\overline{Q}$ connected to said input D.

16. A device as claimed in claim 14, wherein said summer comprises:

a load arranged between said output terminal and the ground;

a first switching device having the collector connected to said output terminal, the emitter connected to a first current source, and the base connected to receive said first binary sequence a(0,1);

an inverter for receiving said second binary sequence b(0,1) and proving an inverted binary sequence; and a second switching device having the collector connected to said output terminal, the emitter connected to a second current source, and the base connected to said inverter, wherein said first and said second current sources are connected to a supply voltage.

17. A device as claimed in claim 14, further comprising a driver for receiving said duobinary output sequence y(+1, 0,−1) and providing a driving signal.

18. A device as claimed in claim 14, further comprising a pair of differential drivers for receiving said duobinary output sequence y(+1,0,−1) and providing a differential signal comprising a modulating signal and a complementary modulating signal.

19. A Mach-Zehnder (M-Z) interferometer for modulating a continuous wave (CW) optical carrier with a duobinary encoded driving signal, said M-Z interferometer having a first and a second travelling wave-guide, a splitter between an input port and said first and second travelling wave-guides, a combiner between said first and second travelling wave-guides and an output port, a first and a second travelling wave electrode, each associated with said respective first and second travelling wave-guide, and a control electrode, said M-Z interferometer further comprising:

means for applying a bias voltage $V_{Bias}$ between said first and said second travelling wave electrode;

means for providing said duobinary encoded driving signal to said control electrode;

means for coupling said CW optical carrier signal to said input port; and means for coupling a duobinary modulated optical signal from said output port into an optical fiber.

20. A Mach-Zehnder (M-Z) interferometer for modulating a continuous wave (CW) optical carrier with a duobinary encoded differential driving signal, said M-Z interferometer having a first and a second travelling wave-guide, a splitter between an input port and said first and second travelling wave-guides, a combiner between said first and second travelling wave-guides and an output port, a first and a second travelling wave electrode, each associated with said respective first and second travelling wave-guide, said M-Z interferometer further comprising:

means for applying said modulating signal to a splitter side of said first travelling wave electrode and for applying said complementary modulating signal to a splitter side of said second travelling wave electrode;

a first matched impedance for connection with a first end to a combiner side of said first travelling wave electrode and with a second end to ground;

a second matched impedance for connection with a first end to a combiner side of said second travelling wave electrode and with a second end to ground;

means for coupling said CW optical carrier signal to said input port; and means for coupling a duobinary modulated optical signal from said output port into an optical fiber.

* * * * *